United States Patent
Bakre et al.

(10) Patent No.: US 9,626,245 B2
(45) Date of Patent: Apr. 18, 2017

(54) POLICY BASED HIERARCHICAL DATA PROTECTION

(71) Applicant: NetApp, Inc., Sunnyvale, CA (US)

(72) Inventors: Ajay Bakre, Bangalore (IN); Vishnu Vardhan Chandra Kumaran, Bangalore (IN); Alvin Lam, Vancouver (CA); Emalayan Vairavanathan, Vancouver (CA); Viswanath Chandrasekara Bharathi, Bangalore (IN); Vladimir Avram, Vancouver (CA); Dheeraj Raghavender Sangamkar, Vancouver (CA); Oliver Seiler, New Westminster (CA); Carmen Lum, Vancouver (CA)

(73) Assignee: NetApp, Inc., Sunnyvale, CA (US)

( * ) Notice: Subject to any disclaimer, the term of this patent is extended or adjusted under 35 U.S.C. 154(b) by 50 days.

(21) Appl. No.: 14/627,769

(22) Filed: Feb. 20, 2015

(65) Prior Publication Data
US 2016/0246676 A1    Aug. 25, 2016

(51) Int. Cl.
*G11C 29/00*   (2006.01)
*G06F 11/10*   (2006.01)
*G06F 3/06*    (2006.01)

(52) U.S. Cl.
CPC .......... *G06F 11/1076* (2013.01); *G06F 3/064* (2013.01); *G06F 3/0619* (2013.01); *G06F 3/0689* (2013.01)

(58) Field of Classification Search
CPC .... G06F 11/1076; G06F 3/0619; G06F 3/064; G06F 3/0689
See application file for complete search history.

(56) References Cited

U.S. PATENT DOCUMENTS

| | | | |
|---|---|---|---|
| 2010/0185963 A1* | 7/2010 | Slik | G06F 17/30082 715/764 |
| 2012/0166726 A1* | 6/2012 | De Schrijver | G06F 11/2094 711/114 |

* cited by examiner

*Primary Examiner* — Sam Rizk
(74) *Attorney, Agent, or Firm* — Gilliam IP PLLC

(57) ABSTRACT

A method, non-transitory computer readable medium, and storage management computing device that obtains an information lifecycle management (ILM) policy. A data protection scheme to be applied at a storage node computing device level is determined and a plurality of storage node computing devices are identified based on an application of the ILM policy to metadata received from one of the storage node computing devices and associated with an object ingested by the one of the storage node computing devices. The one of the storage node computing devices is instructed to generate one or more copies of the object or fragments of the object according to the data protection scheme and to distribute the object copies or one of the object fragments to one or more other of the storage node computing devices to be stored by at least the one or more other storage node computing devices on one or more disk storage devices.

20 Claims, 6 Drawing Sheets

POLICY BASED HIERARCHICAL DATA PROTECTION

FIELD

This technology generally relates to data storage systems and more particularly to methods and devices for facilitating policy-based data protection in data storage systems.

BACKGROUND

Enterprises increasingly have a need to store large amounts of data in data storage systems that include many storage devices (e.g., nodes and disk shelves) spread across data centers in numerous geographic locations (referred to herein as sites). Such data storage systems generally implement data protection scheme(s) to facilitate recovery or increased availability of data when physical component(s) of the systems fail or are otherwise down or unavailable. Exemplary data protection schemes include replication, redundant array of independent disks (RAID), dynamic disk pools (DDP), and erasure coding.

However, each of these schemes has advantages and disadvantages. For example, replication is the simplest of these schemes to implement but has a high storage overhead due to the storage of multiple copies of objects. RAID 5, RAID 6, and RAID-DP, for example, all allow protection against failure of one or more storage units (e.g., disks) with low storage overhead and some computation, but these schemes require significant effort to reconstruct failed disks and can leave a storage system vulnerable if additional failures occur while a rebuild is taking place. DDP distributes data, parity information, and spare capacity across a pool of drives. Its intelligent algorithm defines which drives are used for segment placement, ensuring full data protection, but providing slower retrieval times. Erasure coding refers to the use of a forward error correction (FEC) code to add redundant information to stored data in a way that spreads encoded fragments of data across multiple storage units. Most erasure codes either require high repair bandwidth to recover from component failures or additional storage overhead to allow localized repairs, but usually erasure coding requires less storage overhead than RAID protection schemes. Further comparing to RAID and DDP, erasure coding is more resilient to failures as it can also tolerate node, rack or data-center failures in addition to device failures.

Many current data storage systems use a single data protection scheme that attempts to match data protection needs at different levels in a hierarchy of components that comprise a data storage system. The result of using a single data protection scheme is excess storage overhead, unacceptable levels of repair load on the data storage system, and/or inability to support multiple failure types. Accordingly, some current data storage systems facilitate hierarchical data protection by implementing replication at the storage node level in combination with a RAID or DDP data protection scheme at the disk level. However, these data storage systems require full object copies and associated significant storage overhead in order to protect against storage node and site failures.

SUMMARY

A method for policy-based hierarchical data protection includes obtaining, by a storage management computing device, an information lifecycle management (ILM) policy. A data protection scheme to be applied at a storage node computing device level is determined and a plurality of storage node computing devices are identified by the storage management computing device based on an application of the ILM policy to metadata received from one of the storage node computing devices and associated with an object ingested by the one of the storage node computing devices. The one of the storage node computing devices is instructed by the storage management computing device to generate one or more copies of the object or a plurality of fragments of the object according to the data protection scheme and to distribute the object copies or one of the object fragments to one or more other of the storage node computing devices to be stored by at least the one or more other storage node computing devices on one or more disk storage devices.

A non-transitory computer readable medium having stored thereon instructions for policy-based hierarchical data protection comprising executable code which when executed by a processor, causes the processor to perform steps including obtaining an information lifecycle management (ILM) policy. A data protection scheme to be applied at a storage node computing device level is determined and a plurality of storage node computing devices are identified based on an application of the ILM policy to metadata received from one of the storage node computing devices and associated with an object ingested by the one of the storage node computing devices. The one of the storage node computing devices is instructed to generate one or more copies of the object or a plurality of fragments of the object according to the data protection scheme and to distribute the object copies or one of the object fragments to one or more other of the storage node computing devices to be stored by at least the one or more other storage node computing devices on one or more disk storage devices.

A storage platform computing apparatus including a processor and a memory coupled to the processor which is configured to be capable of executing programmed instructions comprising and stored in the memory to obtain an information lifecycle management (ILM) policy. A data protection scheme to be applied at a storage node computing device level is determined and a plurality of storage node computing devices are identified based on an application of the ILM policy to metadata received from one of the storage node computing devices and associated with an object ingested by the one of the storage node computing devices. The one of the storage node computing devices is instructed to generate one or more copies of the object or a plurality of fragments of the object according to the data protection scheme and to distribute the object copies or one of the object fragments to one or more other of the storage node computing devices to be stored by at least the one or more other storage node computing devices on one or more disk storage devices.

This technology provides a number of advantages including providing methods, non-transitory computer readable media, and devices that more effectively facilitate policy-based hierarchical data protection for enterprises. With this technology, application administrators can establish ILM policies for objects that define data protection schemes tailored to performance and reliability requirements and the amount of storage overhead that can be tolerated at various storage levels in a data storage system hierarchy. More generally, this technology facilitates hierarchical data protection that allows combination of multiple data protection schemes to be used at multiple layers of a storage system.

For example, administrators can establish ILM policies that require implementing erasure coding as a data protection scheme for certain objects at the storage node level, and thereby protect against site and node failures with reduced storage overhead, although many permutations of data protection schemes and levels are possible based on this technology. By leveraging user-specified policies (e.g., ILM policies) to specify data protection schemes that have to be used at multiple layers of a storage system, data management cost in the storage system can be reduced as the system can automatically act based on the contents of the policy without manual intervention. Additionally, by using such policies, errors resulting from such manual intervention and manual data management can also advantageously be reduced with this technology.

DETAILED DESCRIPTION

Figure 1:
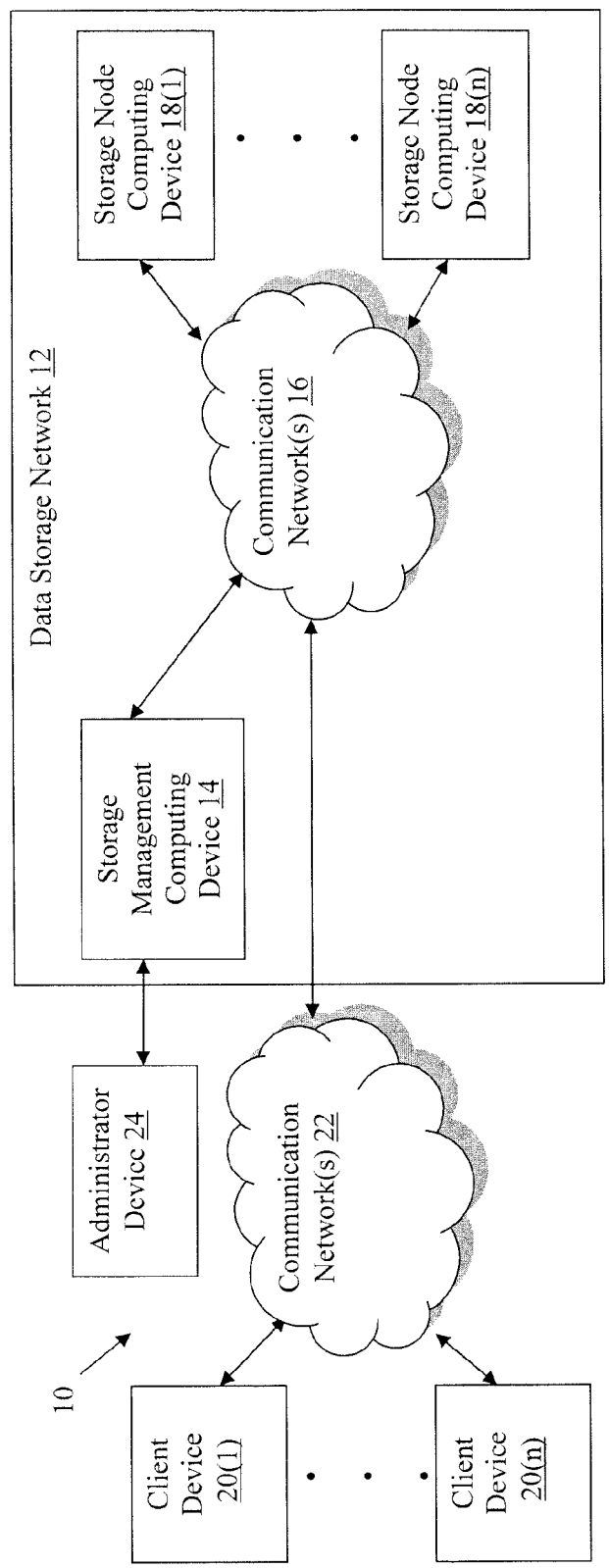
FIG. 1 a block diagram of a network environment with an exemplary storage platform computing apparatus with an exemplary storage management computing device and storage node computing devices.

A network environment 10 including an example of a data storage network 12 is illustrated in FIG. 1. The data storage network 12 includes a storage management computing device 14 coupled by communication network(s) 16 to storage node computing devices 18(1)-18(n), one or more of which can be located at different geographic locations or sites. The storage node computing devices 18(1)-18(n) are coupled to a plurality of client devices 20(1)-20(n) by communication network(s) 16 and 22. Additionally, the storage management computing device 14 is coupled to an administrator device 24. In other examples, this network environment 10 can include other numbers and types of systems, devices, components, and/or elements in other configurations. This technology provides a number of advantages including methods, non-transitory computer readable media, and devices that facilitate data protection schemes in data storage networks and more effectively manage storage resource utilization based on application requirements.

Figure 2:
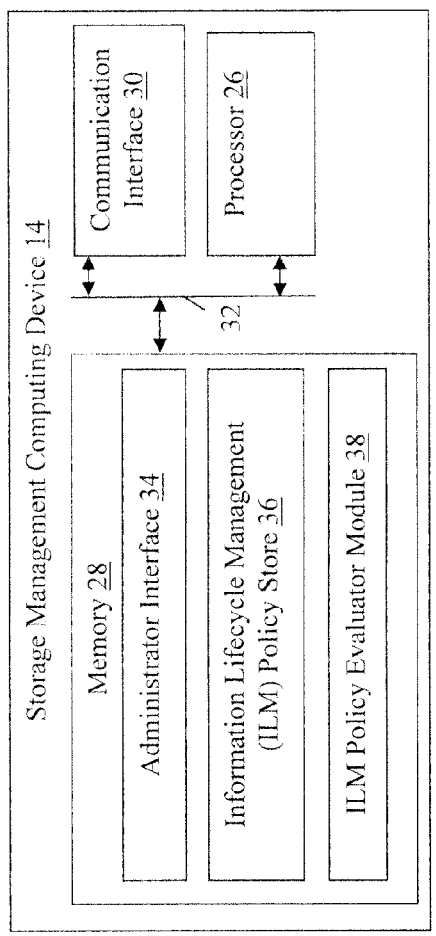
FIG. 2 is a block diagram of the exemplary storage management computing device.

Referring to FIG. 2, a block diagram of the exemplary storage management computing device 14 is illustrated. The storage management computing device 14 receives requests from the storage node computing devices 18(1)-18(n) to evaluate information lifecycle management (ILM) policies established by an administrator based on metadata associated with objects. Based on the application of the ILM policies, the storage management computing device 14 determines storage locations for objects and data protection scheme(s) to use for storage of the object. The storage management computing device 14 further instructs the storage node computing devices 18(1)-18(n) to implements a storage node computing device level data protection schemes in order to provide high availability and failure protection, as described and illustrated in more detail later.

The storage management computing device 14 in this example includes a processor 26, a memory 28, and a communication interface 30, which are all coupled together by a bus 32 or other communication link, although the storage management computing device 14 can have other types and numbers of components or other elements. The processor 26 of the storage management computing device 14 executes a program of stored instructions for one or more aspects of this technology, as described and illustrated by way of the embodiments herein, although the processor 26 could execute other numbers and types of programmed instructions. The processor 26 in the storage management computing device 14 may include one or more central processing units or general purpose processors with one or more processing cores, for example.

The memory 28 of the storage management computing device 14 may include any of various forms of read only memory (ROM), random access memory (RAM), Flash memory, non-volatile, or volatile memory, or the like, or a combination of such devices for example. In this example, the memory 28 further includes an administrator interface 34, an ILM policy store 36, and an ILM policy evaluator module 38, although other numbers and types of modules and applications can also be included in the memory 28 and one or more of the administrator interface 34, an ILM policy store 36, and an ILM policy evaluator module 38 can be stored elsewhere in the data storage network 12.

The administrator interface 34 is a graphical user interface presented to a user of the administrator device 24 to facilitate the submission of ILM policies for applications associated with the client devices 20(1)-20(n), as described and illustrated in more detail later. The ILM policy store 36 stores these policies that establish rules defining various aspects of the storage of data on the data storage network 12, including the data protection schemes to be utilized at various levels of storage in the data storage network 12, as described and illustrated in more detail later. The ILM policy evaluator module 38 is configured to evaluate the ILM policies stored in the ILM policy store 36 for ingested objects to determine the data protection schemes to be used in the storage of the objects, also as described and illustrated in more detail later.

The communication interface 30 of the storage management computing device 14 in this example operatively couples and communicates between the storage node computing devices 18(1)-18(n) over communication network(s) 16 and the administrator device 24, although other types and numbers of communication networks or systems with other types and numbers of connections and configurations to other devices and elements can also be used.

By way of example only, the communication network(s) 16 and 22 can use TCP/IP over Ethernet and industry-standard protocols, including NFS, CIFS, SOAP, XML, LDAP, and SNMP, although other types and numbers of communication networks, can be used. The communication network(s) 16 and 22 in this example may employ any suitable interface mechanisms and network communication technologies including, for example, teletraffic in any suitable form (e.g., voice, modem, and the like), Public Switched Telephone Network (PSTNs), Ethernet-based Packet Data Networks (PDNs), combinations thereof, and the like.

Figure 3:
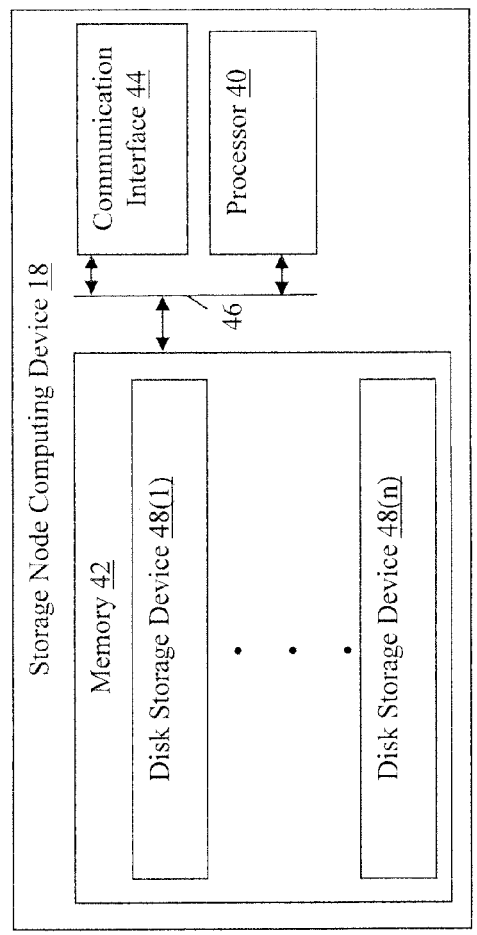
FIG. 3 is a block diagram of one of the exemplary storage node computing devices.

Referring to FIG. 3, a block diagram of one of the exemplary storage node computing devices 18(1)-18(n) is illustrated. The storage node computing device 18 is generally configured to receive requests to write and read data from the client devices 20(1)-20(n) over the communication network(s) 16 and 22. In response to the write requests, the storage node computing device 18 queries the storage management computing device 14 for instructions on a data protection plan to be implemented to store an ingested object at a storage node computing device level. Additionally, the storage node computing device 18 writes data to storage devices according to a disk storage device level data protection scheme, as described and illustrated in more detail later. Accordingly, the storage node computing device 18 in this example includes a processor 40, a memory 42, and a communication interface 44, which are all coupled together by a bus 46 or other communication link, although the storage node computing device 18 can have other types and numbers of components or other elements.

The processor 40 of the storage node computing device 18 executes a program of stored instructions for one or more aspects of this technology, as described and illustrated by way of the embodiments herein, although the processor 40 could execute other numbers and types of programmed instructions. The processor 40 in the storage node computing device 18 may include one or more central processing units or general purpose processors with one or more processing cores, for example.

The memory 42 of the storage node computing device 18 may include any of various forms of read only memory (ROM), random access memory (RAM), Flash memory, non-volatile, or volatile memory, or the like, or a combination of such devices for example. In this example, the memory 42 further includes disk storage devices 48(1)-48(n). The disk storage device(s) 48(1)-48(n) can include optical disk-based storage, solid state drives, or any other type of storage devices suitable for storing files or objects for short or long term retention, for example. Other types and numbers of storage deices can be included in the memory 42 or coupled to the storage node computing device 18 in other examples. Additionally, one or more disk shelves with storage devices can be included in the data storage network 12 in one or more separate or dedicated storage servers in other examples.

The communication interface 44 of the storage node computing device 18 in this example operatively couples and communicates between the storage node computing device 18 and the storage management computing device 14 via the communication network(s) 16 and the storage node computing device 18 and the client devices 20(1)-20(n) via the communication networks 16 and 22, although other types and numbers of communication networks or systems with other types and numbers of connections and configurations to other devices and elements can also be used.

Each of the client devices 20(1)-20(n) includes a processor, a memory, a communication interface, and, optionally, an input device and a display device, which are coupled together by a bus or other communication link, although the client devices 20(1)-20(n) can have other types and numbers of components or other elements. The client devices 20(1)-20(n) may communicate with the storage node computing devices 18(1)-18(n) to store and retrieve data, as described and illustrated in more detail later. One or more of the client devices 20(1)-20(n) may be, for example, a conventional personal computer, a server hosting application(s) that utilize back-end storage provided by the data storage network 12, or any other type of processing and/or computing device.

The administrator device 24 includes a processor, a memory, a communication interface, an input device, and a display device, which are coupled together by a bus or other communication link, although the administrator device 24 can have other types and numbers of components or other elements. The administrator device 24 may communicate with the storage management computing device 14 to establish ILM policies for storing the data communicated by the client devices 20(1)-20(n) on the data storage network 12, as described and illustrated in more detail later.

The administrator device 24 communicates with the storage management computing device 14 over a local area network (LAN) (not shown) in this example, although the administrator device 24 can also communicate with the storage management computing device 14 over the communication network(s) 22 in other examples. The administrator device 24 can be a conventional personal computer, a laptop, a tablet computing device, a smart phone, or any other type of processing and/or computing device.

Although examples of the storage management computing device 14, storage node computing devices 18(1)-18(n), client devices 20(1)-20(n), and administrator device 24 are described herein, it is to be understood that the devices and systems of the examples described herein are for exemplary purposes, as many variations of the specific hardware and software used to implement the examples are possible, as will be appreciated by those skilled in the relevant art(s). In addition, two or more computing systems or devices can be substituted for any one of the systems in any embodiment of the examples.

The examples also may be embodied as one or more non-transitory computer readable media having instructions stored thereon for one or more aspects of the present technology, as described and illustrated by way of the examples herein, which when executed by a processor, cause the processor to carry out the steps necessary to implement the methods of this technology, as described and illustrated with the examples herein.

Figure 4:
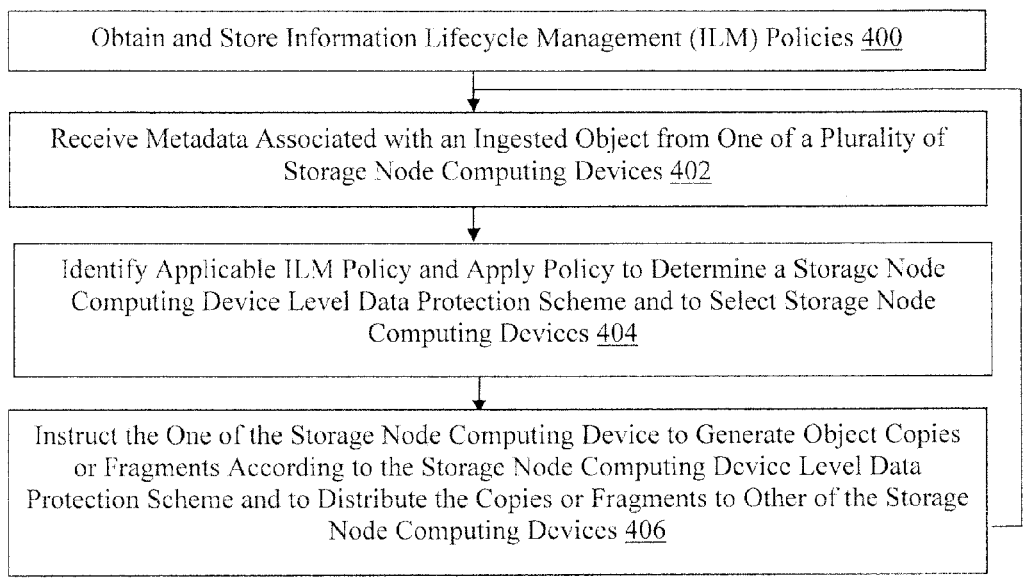
FIG. 4 is a flowchart of an exemplary method for implementing policy-based data protection with the exemplary storage management computing device.

An exemplary method for policy-based data protection will now be described with reference to FIGS. 1-7. Referring more specifically to FIG. 4, an exemplary method for implementing policy-based data protection with the storage management computing device 14 is illustrated. In step 400 in this particular example, the storage management computing device 14 obtains a plurality of information lifecycle management (ILM) policies, as described and illustrated in more detail in U.S. Pat. No. 8,898,267, which is hereby incorporated by reference in its entirety. The ILM policies can be obtained from an administrator using the administrator device 24 and via the administrator interface 34 provided by the storage management computing device 14. Additionally, the ILM policies can be established by administrators of applications executing on the client devices 20(1)-20(n) or an administrator of the data storage network 12, for example. Subsequent to obtaining the ILM policies, the storage management computing device 14 can store the ILM policies in the ILM policy store 36.

In this example, the ILM policies establish data protection schemes including a storage node computing device level data protection scheme and a disk storage device level data protection scheme. The ILM policies optionally further specify various storage parameters for objects (e.g., the number of copies, fragments, storage node computing devices to be used, disk storage devices to be used, the locations of the storage node computing devices 18(1)-18(n) or disk storage devices 48(1)-48(n), or retention time). The data protection schemes are to be implemented for objects sharing certain specified characteristics or associated metadata (e.g., object type, address, or origin) in order to facilitate high availability and protection of the objects in the event of a failure of a component (e.g., site, node, or disk) of the data storage network 12.

In some examples, the storage node computing device level data protection scheme can be a replication or an erasure coding data protection scheme and the disk storage device level data protection scheme can be a replication, an erasure coding, a redundant array of independent disks (RAID), a dynamic disk pool (DDP) data protection scheme, or a just a bunch of disks (JBOD). The disk storage device level data protection scheme is preconfigured for the storage node computing devices 18(1)-18(n) identified in the ILM policies that will store objects satisfying the ILM policies. In other examples, other numbers and types of data protection schemes can be specified for other numbers of data storage network hierarchical levels.

Accordingly, this technology allows administrators to define data protection schemes for various hierarchical levels of the data storage network 12 based on application requirements, desired retrieval speed, various service level objectives, tolerable storage overhead, or tolerable amount of time for a rebuild, for example, among other considerations or parameters. In one particular example, an administrator can specify an erasure coding data protection scheme for certain objects at the storage node computing device level and thereby protect against multiple node or entire site failures with less storage overhead than using a replication data protection scheme, as described and illustrated in more detail later with reference to FIG. 5.

In step 402, the storage management computing device 14 receives metadata from one of the storage node computing devices 18(1)-18(n). The metadata is associated with an object ingested by the one of the storage node computing devices 18(1)-18(n). The object can be ingested following a write request received from an application executing on one of the client devices 20(1)-20(n) to write or store data in the data storage network 12, for example. The associated metadata can include the originating application, device type, or geographic location or namespace address, for example, among other types and numbers of metadata.

In step 404, the storage management computing device 14 identifies and applies one of the ILM policies obtained in step 400 and stored in the ILM policy store 36 based at least in part on the metadata associated with the object. In this particular example, the ILM policy evaluator module 38 of the storage management computing device 14 analyzes the object and associated metadata to determine one or more of the ILM policies that is applicable to the object.

In one example, the metadata is an address prefix or path common to the object and one or more other objects. Accordingly, the ILM policy evaluator module 38 identifies the one or more of the ILM policies to be applied to the object based on the address prefix in this example, and the same one or more ILM policies are therefore identified for all objects sharing an address prefix. Accordingly, this technology advantageously facilitates applying the same set of ILM policies and specified data protection schemes for objects associated with a common bucket or namespace address.

Additionally, the storage management computing device 14 applies the identified ILM policies to determine at least a storage node computing device level data protection scheme and associated parameters to be implemented for the object, as well as to select at least a subset of the storage node computing devices 18(1)-18(n) that will store the object. In one particular example, administrators can optionally create erasure coding profiles that identify a logical grouping of at least a subset of the storage node computing devices 18(1)-18(n) and one or more erasure coding parameters (e.g., type of erasure coding data protection scheme). By allowing administrators to include various erasure coding parameters in erasure coding profiles, the implemented erasure coding storage node computing device level data protection schemes can be tuned based on desired cost, performance, durability, or accessibility, for example.

An erasure coding profile can then be attached to or associated with an ILM policy such that objects satisfying the ILM policy will be moved into storage space instantiated by the creation of the erasure coding profile, as specified by the erasure coding profile, as described and illustrated in more detail later. Each of the selected subset of the storage node computing devices 18(1)-18(n) is coupled to a plurality of disk storage devices 48(1)-48(n) and is preconfigured to store objects according to a disk storage device level data protection scheme. Other methods of identifying the subset of the storage node computing devices 18(1)-18(n) on which to store the object can also be used.

In step 406, the storage management computing device 14 instructs the one of the storage node computing devices 18(1)-18(n) that ingested the object and sent the associated metadata to generate object copies or fragments according to the storage node computing device level data protection scheme specified in the ILM policy identified in step 404. Accordingly, if the ILM policy specifies that a replication data protection scheme should be implemented for the object with one object copy sent to one of the storage node computing devices 18(1)-18(n) at each of three sites, then the storage management computing device 14 instructs the one of the storage node computing device 18(1)-18(n) to generate and distribute at least two copies of the object.

Figure 5:
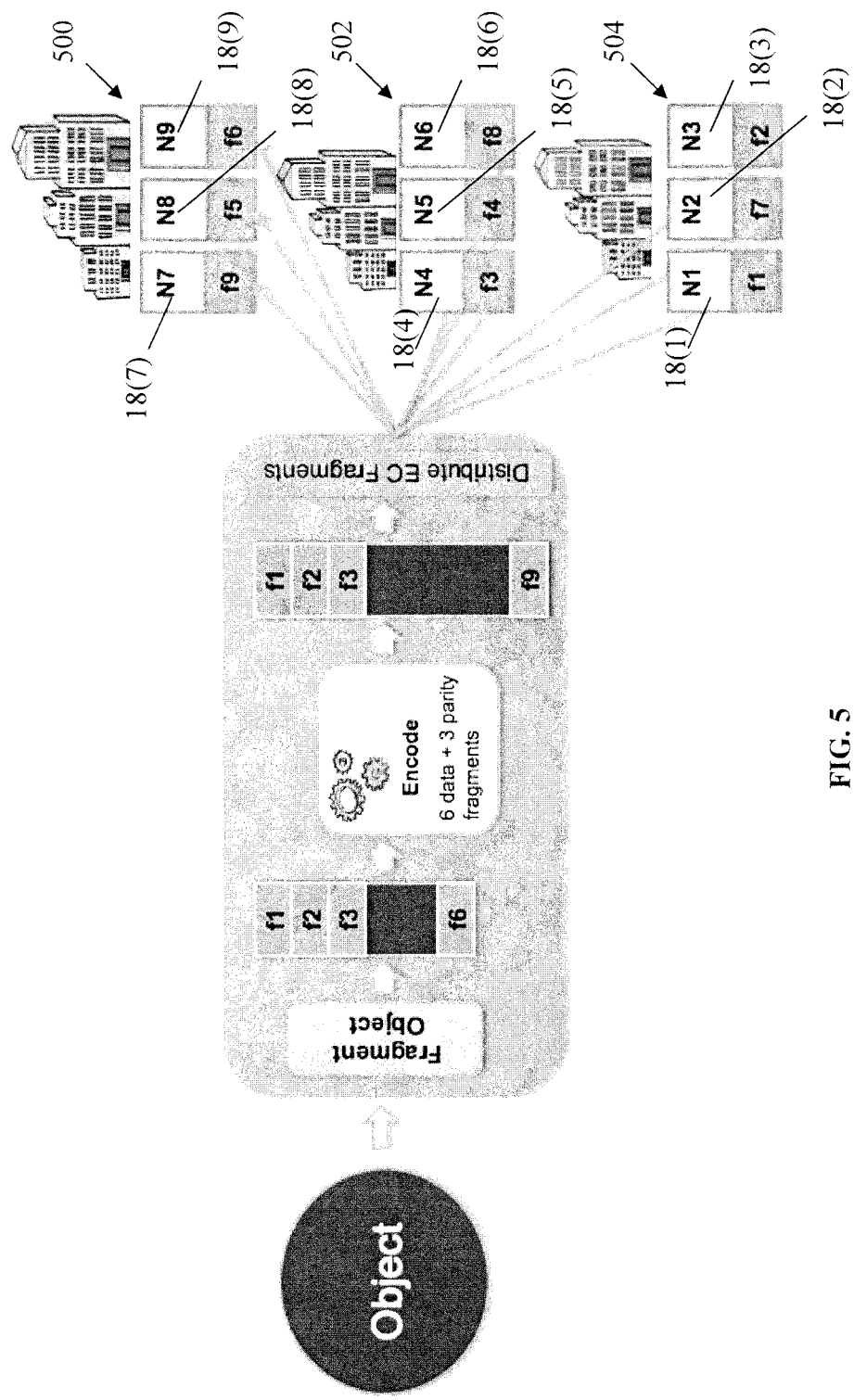
FIG. 5 is a functional flow diagram illustrating a method of implementing erasure coding with the exemplary storage management computing device using three sites with three of the exemplary storage node computing devices located at each site.

Alternatively, if the ILM policy specifies that a 6+3 erasure coding data protection scheme should be implemented for the object in a data storage network with three sites having three of the storage node computing devices 18(1)-18(n) each, then the storage management computing device 14 instructs the one of the storage node computing devices to generate nine object fragments and distribute at least eight of the nine fragments (as described and illustrated in more detail later with reference to FIG. 5). In other examples, other numbers and types of copies and fragments (e.g., stripes or any other portion of an object or parity fragment associated with an object) can be generated based on the storage node computing device level data protection scheme specified in the ILM policy applicable to the ingested object.

Accordingly, in this example the storage management computing device 14 instructs the one of the storage node computing devices 18(1)-18(n) to send one of the object copies or one of the object fragments to each of the subset of the storage node computing devices 18(1)-18(n) selected in step 404 as specified in the ILM policy. Upon receipt, the subset of the storage node computing devices 18(1)-18(n) store the object copies or fragments on local or coupled disk storage devices 48(1)-48(n) according to a preconfigured disk storage device level data protection scheme. Accordingly, in this particular example, objects can advantageously be ingested into erasure-coded or replicated storage tiers that are optionally collocated or share at least some of the same hardware resources.

Referring to FIG. 5, a method of implementing erasure coding with the storage management computing device 14 using three sites with three of the storage node computing devices 18(1)-18(n) located at each site is illustrated. In this particular example, the data storage network 12 includes three different geographic locations or sites 500, 502, and 504. Additionally, three storage node computing devices 18(7), 18(8), and 18(9), 18(4), 18(5), and 18(6), and 18(1), 18(2), and 18(3) are located at each of the sites 500, 502, and 504, respectively.

In this example, an object is ingested from one of the client devices 20(1)-20(n) by the storage node computing device 18(1). The storage node computing device 18(1) sends metadata associated with the object to the storage management computing device 14, which identifies an ILM policy based on the metadata. The ILM policy in this particular example specifies a 6+3 erasure coding data protection scheme for the storage node computing device level. Accordingly, the storage management computing device 14 instructs the storage node computing device 18(1) to generate object fragments including six data fragments and three parity fragments. Optionally, the storage node computing device 18(1) implements a Reed-Solomon erasure coding data protection scheme in this example, although other types of erasure coding data protection schemes can also be implemented in other examples.

Additionally, the ILM policy in this example specifies that the object fragments should be distributed evenly across all of the storage node computing devices 18(1)-18(9) of the three sites 500, 502, and 504 of the data storage network 12. Therefore, the storage management computing device 14 also instructs the storage node computing device 18(1) to send one of the object fragments to each of the storage node computing devices 18(2)-18(9) (and to retain one of the generated fragments) in order to store the fragments on associated disk storage devices 48(1)-48(n) according to a preconfigured disk storage device level data protection scheme.

Accordingly, in this particular example, the object fragments are advantageously distributed to the storage node computing devices 18(1)-18(9) located in different ones of the geographic sites 500, 502, and 504 such that the object is repairable in the event of a failure of all of the storage node computing devices that are located at any one of the different ones of the geographic sites 500, 502, and 504 (e.g., 18(7), 18(8), and 18(9), 18(4), 18(5), and 18(6), or 18(1), 18(2), and 18(3)).

Additionally, the storage of the object according to the storage node computing device level data protection scheme in this example requires less storage overhead than a replication storage node computing device level data protection scheme that could similarly protect against a failure of one of the geographic sites 500, 502, and 504. In other examples, the object fragments can be distributed to the storage node computing devices 18(1)-18(9) located in a same one of the geographic sites 500, 502, or 504 such that the object is repairable in the event of a failure of one or more of the storage node computing devices located at the same one of the geographic sites 500, 502, or 504. In yet other examples, other types of storage node computing device level data protection schemes can be implemented based on the various characteristics of the data storage network 12 (e.g., number of storage node computing devices and number of sites) in order to protect against the failure of an entire site or one or more storage node computing devices located at a site.

Figure 6:
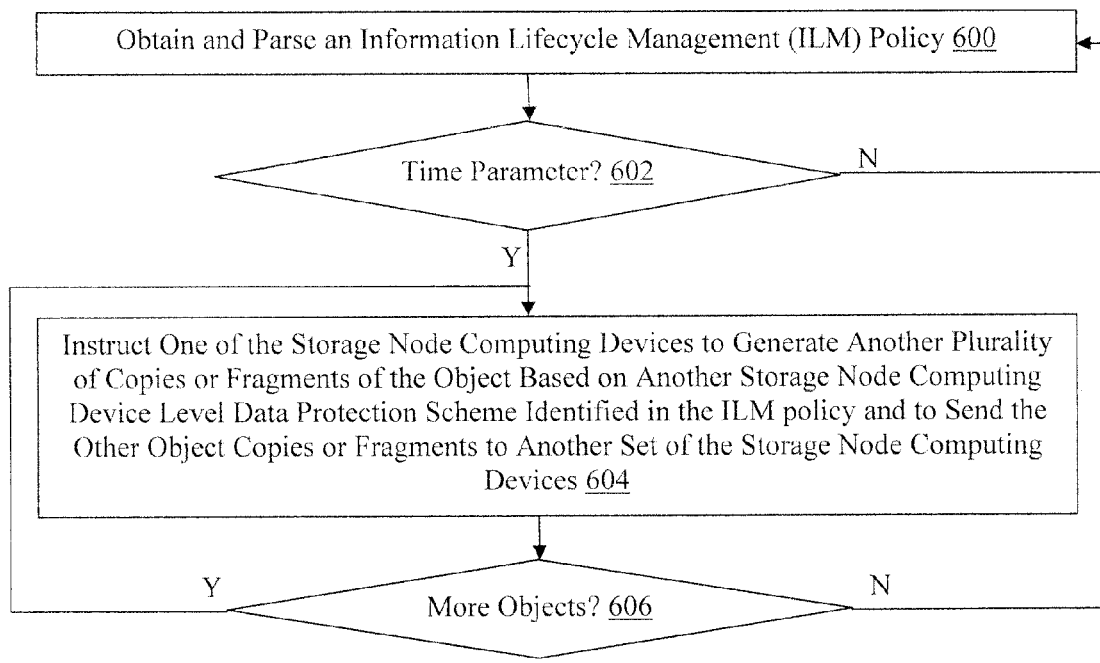
FIG. 6 is a flowchart of an exemplary method for modifying the protection scheme(s) used to store certain objects in a data storage network over time and based on a policy.

Referring to FIG. 6, a method for modifying the protection scheme(s) used to store certain objects in the data storage network 12 over time and based on a policy is illustrated. In step 600 in this particular example, the storage management computing device 14 obtains and parses an ILM policy, optionally with the ILM policy evaluator module 38 and stored in the ILM policy store 36. The parsing of ILM policies in step 600 can be performed periodically for various of the ILM policies in the ILM policy store 36, for example, although other methods of identifying the ILM policy to parse can also be used. In this particular example described and illustrated with reference to FIG. 6, the data protection scheme(s) used to store object(s) are modified based on a policy reevaluation subsequent to the expiration of a predefined time period. However, in other examples, ILM policies can be evaluated in response to a change in metadata associated with object(s), retrieval of object(s), or upon losing an object, for example, and ILM policies can also be evaluated for other reasons, based on other criteria, or at other times.

In step 602, the storage management computing device 14 determines when a time period parameter is included in the ILM policy based on the parsing. If the storage management computing device 14 determines a time period parameter is not specified in the ILM policy, then the No branch is taken and the storage management computing device 14 proceeds back to step 600 and obtains and parses another ILM policy. However, if the storage management computing device 14 determines that a time period parameter is specified in the ILM policy, then the Yes branch is taken to step 604.

In step 604, the storage management computing device 14 identifies an object for which the time period parameter is applicable and for which the specified time period has elapsed. The object can be identified based on metadata associated with the object such as an origin of the object or an address of the object, as well as a date and time at which the object was ingested or stored. Accordingly, the time period parameter of the ILM policy may specify that for objects having a "/tax-docs" path, a 6+3 erasure coded version of the objects will be maintained at the storage node computing device level for one year and, subsequent to one year, three replicated copies of the object will be maintained at the storage node computing device level. Any other permutation of data protection schemes at various hierarchical levels of the data storage network 12 can also be used and modified over time.

Accordingly, in step 604 the storage management computing device 14 instructs one of the storage node computing devices 18(1)-18(n) to retrieve the identified object and to generate object copies or object fragments according to another storage node computing device level data protection plan for the object. The other storage node computing device level data protection plan can be the same or different than the storage node computing device level data protection plan initially implemented for the object at the storage node computing device level, such as in steps 404-408 of FIG. 4, for example.

Additionally, in step 604, the storage management computing device 14 also instructs the one of the storage node computing devices 18(1)-18(n) to send a storage request with generated object copies or fragments to one or more selected ones of the storage node computing devices 18(1)-18(n) that are associated with another disk storage device level data protection scheme and are specified in the ILM policy. The other disk storage device level data protection scheme can be the same or different than the disk level data protection scheme initially implemented for the object at the disk storage device level. However, at least one of the storage node computing device level data protection scheme or the disk storage device level data protection scheme must be different than that used to initially store the object.

Subsequent to receiving the storage request with the object copies or fragments, the one or more of the storage node computing devices 18(1)-18(n) can store the object copies or fragments according to the preconfigured other disk storage device level data protection scheme. Additionally, the object copies or fragments initially stored in the disk storage devices 48(1)-48(n) following the initial ingest can be removed from the disk storage devices 48(1)-48(n) following the retrieval of the object in step 604 of FIG. 6 or the storing of the object by the storage node computing devices 18(1)-8(n) on the disk storage devices 48(1)-48(n) according to the other disk level data protection scheme. While in this particular example the object is moved, a new object can be created or the object can be purged as a result of the ILM policy reevaluation, and other actions can also be taken with respect to the object in other examples.

In step 606, the storage management computing device 14 determines where there are any more objects implicated by the time period parameter of the ILM policy. If the storage management computing device 14 determines there are no more objects implicated by the time period parameter of the ILM policy, then the No branch is taken and the storage management computing device 14 proceeds back to step 600 and obtains and parses another ILM policy. However, if the storage management computing device 14 determines that there is at least one more object implicated by the time period parameter of the ILM policy, then the Yes branch is taken and the storage management computing device 14 proceeds back to step 604.

Figure 7:
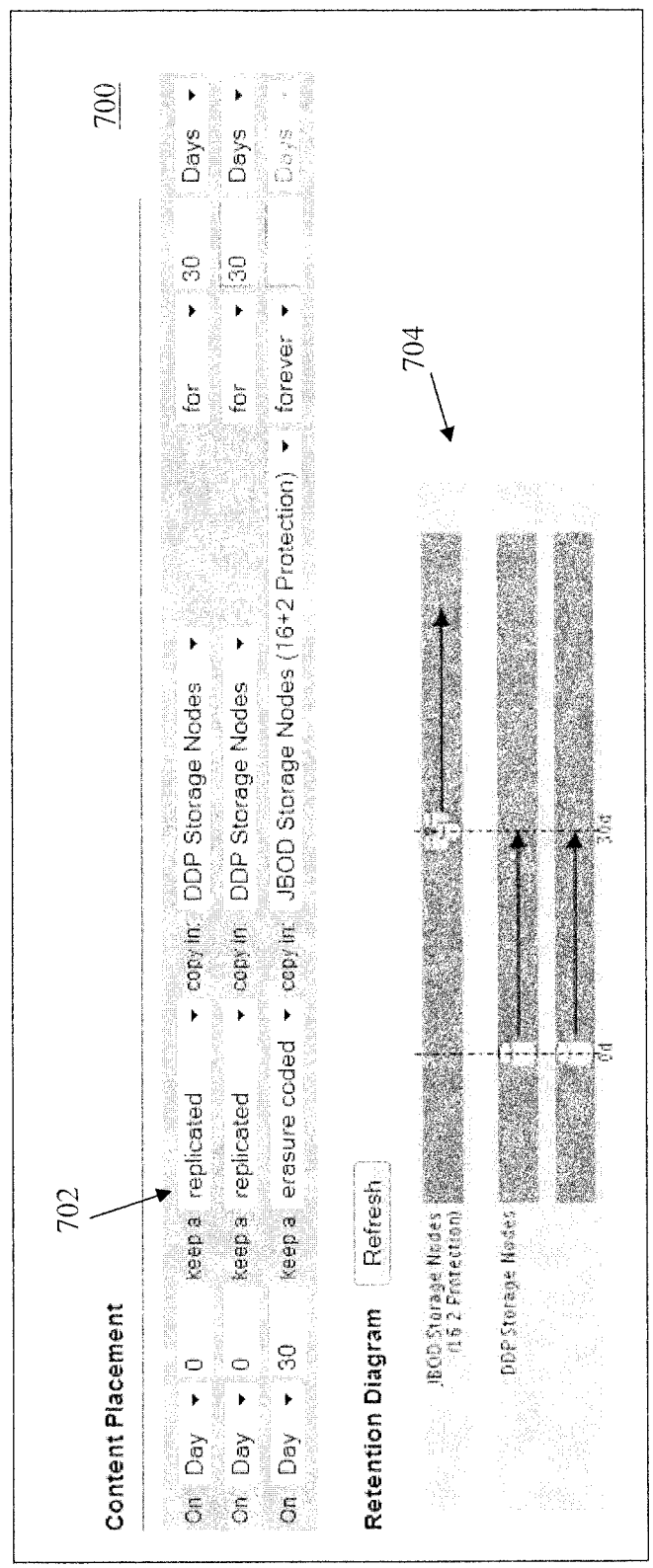
FIG. 7 is a screenshot of an exemplary interface used to establish a policy for modifying the protection scheme(s) used to store certain objects in a data storage network over time.

Referring to FIG. 7, a screenshot of an exemplary interface 700 used to establish an ILM policy for modifying the data protection scheme(s) used to store certain objects in the data storage network 12 over time is illustrated. The interface 700 in this particular example include a drop-down menu 702 that allows an administrator to select whether an object should be replicated or distributed (e.g., by erasure coding) according to the storage node computing device level data protection scheme, as well the storage node computing devices 18(1)-18(n) that should be used to implement the scheme. Additionally, the interface 700 includes other fields and menus that allow an administrator to establish the number of days that an object should be stored according to the storage node computing device level data protection scheme. Other types of interfaces with other fields and menus can also be used for establishing ILM policies in other examples. Optionally, the interface 700 also includes a retention diagram 704 that graphically indicates the various data protection schemes selected by the administrator as associated with the ILM policy.

Accordingly, with this technology, application administrators can establish ILM policies that provide hierarchical data protection used to store data at various levels in a data storage network according to application, data center, or data storage network requirements or designs. In one specific example of this technology, objects can be erasure coded across sites of a data storage network to provide protection against site failure using less storage overhead, and associated cost, than replicating objects across the sites. Advantageously, data protection schemes at various data storage network levels can be selected for individual objects or collections of objects sharing characteristics or an address prefix, for example. Additionally, administrators can establish policies that modify the data protection scheme(s) used to store objects over time in order to more effectively utilize data storage network components while still satisfying application requirements.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A method comprising:
   evaluating, by a first computing device, an information lifecycle management (ILM) policy that indicates a first data protection scheme to apply at a first level of a distributed storage system at object ingest based on object metadata and a second data protection scheme to apply at the first level of the distributed storage system if a condition is satisfied based, at least in part, on object metadata;
   based on the evaluating, determining objects, which are already stored in the distributed storage system according to the first data protection scheme, to which the information lifecycle management policy applies based on metadata of the objects and determining that the condition is satisfied; and
   instructing, by the first computing device, storage nodes of the distributed storage system to protect the objects across multiple storage nodes of the distributed storage system according to the second data protection scheme at the first level instead of the first data protection scheme at the first level, wherein the instructing causes the objects to be protected in the distributed storage system according to the second data protection scheme at the first level and protected according to a third data protection scheme at a second level corresponding to storage devices of the multiple storage nodes.

2. The method as set forth in claim 1, wherein the first data protection scheme is a replication data protection scheme or an erasure coding data protection scheme, the second data protection scheme is a replication data protection scheme or an erasure coding data protection scheme, and the third data protection scheme is a redundant array of independent disks (RAID), dynamic disk pool (DDP), or just a bunch of disks (JBOD) data protection scheme.

3. The method as set forth in claim 1, wherein determining that the condition is satisfied comprises determining that a time period indicated in the ILM policy has elapsed.

4. The method of claim 1, wherein determining the objects to which the information lifecycle management policy applies comprises determining a namespace indicated by the information lifecycle policy and determining that the objects are within the namespace based on the metadata of the objects.

5. The method of claim 1 further comprising periodically evaluating a plurality of information lifecycle management policies, wherein evaluating the plurality of information lifecycle management policies includes evaluating the information lifecycle management policy.

6. The method of claim 1, wherein evaluating the information lifecycle management policy is in response to expiration of a time period, loss of an object to which the information lifecycle management policy applies, or retrieval of an object to which the information lifecycle management policy applies.

7. The method of claim 1, wherein the instructing comprises the first computing device instructing the storage nodes to remove the objects, as stored according to the first and the third data protection schemes, from the distributed storage system.

8. A non-transitory machine-readable medium comprising program code to:
  evaluate an information lifecycle management policy that indicates a first data protection scheme to apply at a first level of a distributed storage system at object ingest based on object metadata and a second data protection scheme to apply at the first level of the distributed storage system if a condition is satisfied based, at least in part, on object metadata;
  based on evaluation of the information lifecycle management policy,
    determine objects to which the information lifecycle management policy applies based on metadata of the objects, wherein the objects have already been protected in the distributed storage system according to the first data protection scheme,
    determine whether the condition is satisfied; and
  based on a determination that the condition is satisfied, instruct storage nodes of the distributed storage system to protect the determined objects across multiple storage nodes of the distributed storage system according to the second data protection scheme at the first level instead of the first data protection scheme at the first level, wherein instructing the storage node causes the objects to be protected in the distributed storage system according to the second data protection scheme at the first level and protected according to a third data protection scheme at a second level corresponding to storage devices of the multiple storage nodes.

9. The non-transitory machine-readable medium of claim 8, wherein the first data protection scheme is a replication data protection scheme or an erasure coding data protection scheme, the second data protection scheme is a replication data protection scheme or an erasure coding data protection scheme, and the third data protection scheme is a redundant array of independent disks (RAID), dynamic disk pool (DDP), or just a bunch of disks (JBOD) data protection scheme.

10. The non-transitory machine-readable medium of claim 8, wherein the program code to determine whether the condition is satisfied comprises program code to determine whether a time period indicated in the information lifecycle management policy has elapsed.

11. The non-transitory machine-readable medium of claim 8, wherein the program code to determine the objects to which the information lifecycle management policy applies comprises program code to determine a namespace indicated by the information lifecycle policy and to determine objects in the distributed storage system that are within the namespace based on the metadata of the objects.

12. The non-transitory machine-readable medium of claim 8 further comprising program code to periodically evaluate a plurality of information lifecycle management policies, wherein the program code to evaluate the plurality of information lifecycle management policies includes the program code to evaluate the information lifecycle management policy.

13. The non-transitory machine-readable medium of claim 8, wherein the program code to evaluate the information lifecycle management policy comprises the program code to evaluate the information lifecycle management policy in response to expiration of a time period, loss of an object to which the information lifecycle management policy applies, or retrieval of an object to which the information lifecycle management policy applies.

14. The non-transitory machine-readable medium of claim 8, wherein the program code to instruct the storage nodes comprises the program code to instruct the storage nodes to remove the objects, as stored according to the first and the third data protection schemes, from the distributed storage system.

15. An apparatus comprising:
  a processor;
  a network interface; and
  a machine-readable medium comprising program code executable by the processor to cause the apparatus to,
  evaluate an information lifecycle management policy that indicates a first data protection scheme to apply at a first level of a distributed storage system at object ingest based on object metadata and a second data protection scheme to apply at the first level of the distributed storage system if a condition is satisfied based, at least in part, on object metadata;
  based on evaluation of the information lifecycle management policy,
    determine objects to which the information lifecycle management policy applies based on metadata of the objects, wherein the objects have already been protected in the distributed storage system according to the first data protection scheme,
    determine whether the condition is satisfied; and
  based on a determination that the condition is satisfied, instruct, via the network interface, storage nodes of the distributed storage system to protect the determined objects across multiple storage nodes of the distributed storage system according to the second data protection scheme at the first level instead of the first data protection scheme at the first level, wherein instructing the storage node causes the objects to be protected in the distributed storage system according to the second data protection scheme at the first level and protected according to a third data protection scheme at a second level corresponding to storage devices of the multiple storage nodes.

16. The apparatus of claim 15, wherein the first data protection scheme is a replication data protection scheme or an erasure coding data protection scheme, the second data protection scheme is a replication data protection scheme or an erasure coding data protection scheme, and the third data protection scheme is a redundant array of independent disks (RAID), dynamic disk pool (DDP), or just a bunch of disks (JBOD) data protection scheme.

17. The apparatus of claim 15, wherein the program code to determine whether the condition is satisfied comprises program code to determine whether a time period indicated in the information lifecycle management policy has elapsed.

18. The apparatus of claim 15, wherein the program code to determine the objects to which the information lifecycle management policy applies comprises program code to determine a namespace indicated by the information lifecycle policy and to determine objects in the distributed storage system that are within the namespace based on the metadata of the objects.

19. The apparatus of claim 15, wherein the machine-readable medium further comprises program code executable by the processor to cause the apparatus to periodically evaluate a plurality of information lifecycle management policies, wherein the program code to evaluate the plurality of information lifecycle management policies includes the program code to evaluate the information lifecycle management policy.

20. The apparatus of claim 15, wherein the program code to evaluate the information lifecycle management policy comprises the program code to evaluate the information lifecycle management policy in response to expiration of a time period, loss of an object to which the information lifecycle management policy applies, or retrieval of an object to which the information lifecycle management policy applies.

* * * * *